(12) United States Patent
Suryanarayana et al.

(10) Patent No.: US 6,747,485 B1
(45) Date of Patent: Jun. 8, 2004

(54) SENSE AMPLIFIER TYPE INPUT RECEIVER WITH IMPROVED CLK TO Q

(75) Inventors: Samudyatha Suryanarayana, Santa Clara, CA (US); Gajendra P. Singh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/605,264

(22) Filed: Jun. 28, 2000

(51) Int. Cl.[7] .................................................. H03F 3/45
(52) U.S. Cl. ............................ 327/51; 327/57; 327/197
(58) Field of Search ................................ 365/207, 208, 365/189, 156, 233; 327/199, 201, 225, 230, 55, 51, 52, 50, 49, 57; 714/718

(56) References Cited

U.S. PATENT DOCUMENTS

| | | | | | |
|---|---|---|---|---|---|
| 5,883,846 A | * | 3/1999 | Lee | ............................ | 365/207 |
| 5,905,401 A | * | 5/1999 | Sher | ............................ | 327/525 |
| 6,005,796 A | * | 12/1999 | Suwyk et al. | ................ | 365/156 |
| 6,049,501 A | * | 4/2000 | Pantelakis et al. | ..... | 365/230.03 |
| 6,052,328 A | * | 4/2000 | Ternullo, Jr. et al. | ....... | 365/233 |
| 6,087,886 A | * | 7/2000 | Ko | ............................... | 327/408 |
| 6,184,722 B1 | * | 2/2001 | Hayakawa | .................... | 327/55 |
| 6,188,636 B1 | * | 2/2001 | Salomon | ..................... | 365/233 |
| 6,263,460 B1 | * | 7/2001 | Spilo et al. | .................. | 714/718 |

OTHER PUBLICATIONS

R. Heald et al. "Implementation of 3rd–Generation SPARCv9 64b Microprocessor", 2000 IEEE International Solid–State Circuits Conference, Feb. 9, 2000, pp. 412, 413, 334, and 335.

* cited by examiner

Primary Examiner—Tuan T. Lam
Assistant Examiner—Hiep Nguyen
(74) Attorney, Agent, or Firm—Rosenthal & Osha L.L.P.

(57) ABSTRACT

A sense amplifier type input receiver includes a differential receiver circuit operatively coupled to an output stage. The output stage includes a pass gate enabled latch. The differential receiver circuit may output a first differential output and a second differential output. The output stage may include a first pass gate operatively coupled between the first differential output and an output of the output stage, a second pass gate operatively coupled between the second differential output and the pass gate enabled latch, and the pass gate enabled latch may be operatively coupled to the output of the output stage. A first clock signal and second clock signal may be coupled to the first pass gate to enable passing of the first differential output to the output of the output stage, the first and second clock signals may be coupled to the second pass gate to enable passing of the second differential output to the pass gate enabled latch, and the first and second clocks signal coupled to a pass gate of the pass gate enabled latch to enable operation of the pass gate enabled latch. A first inverter may be operatively coupled between the first differential output and the first pass gate, a second inverter operatively coupled between the second differential output and the second pass gate, and a third inverter operatively coupled to the output of the output stage.

4 Claims, 5 Drawing Sheets

SENSE AMPLIFIER TYPE INPUT RECEIVER WITH IMPROVED CLK TO Q

BACKGROUND OF THE INVENTION

In computer and information processing systems, various integrated circuit chips must communicate digitally with each other over common buses. The receiving bus nodes recognize the signal as being high or low using receivers, also referred to as input buffers. Often the receiver is a differential receiver, i.e., a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, the nominal supply voltage for integrated circuits keeps being decreased to reduce power consumption. Additionally, fluctuations of the voltage level during operation can make the voltage level powering a receiver even lower. The lower the supply voltage, the more challenging it is to get a receiver to operate reliably.

The signal frequency at which communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to be reliably recognized at the receiving bus nodes as being high or low. Characteristics that affect the time in which a signal is recognized by a receiver include the set up time of the receiver, i.e., the amount of time before a clock edge that a signal must arrive and settle to a recognized level, and the hold time of the receiver, i.e., the time that the received signal must stay at a certain level in order for that level to be detected by the receiver. Other characteristics that affect the ability of the receiver to determine that state of the received signal include the ability of the receiver to reject input noise and power supply noise and sensitivity, i.e., the ability of the receiver to resolve small voltage differences between the differential inputs of the receiver. There are many kinds of receivers, inverters, differential amplifiers, and sense amplifiers. Sense type of receivers have the advantage of good sensitivity, i.e., almost zero setup time and a specific hold time. These features improve timing for high speed I/O interfaces.

Referring to FIG. 1, a sense amp type input receiver generally includes a differential sense amplifier (10) having a single-ended inverter chain (9). The differential sense amplifier (10) compares the received input voltage (PAD) with the reference voltage (Vref) and resolves the small difference between them using cross-coupled inverters having cross-coupled pmos transistors (101) and (102) and cross-coupled nmos transistors (103) and (104). This cross-coupled inverters are disabled during the pre-charge phase using the transistor (105) and outputs (Sense) and ($\overline{\text{Sense}}$) are pre-charged to $V_{DD}$ using transistors (116) and (120) and equalization is done using transistor (118). During the evaluate phase, voltage difference between the PAD and Vref results in differential voltage across the cross-coupled inverters by enabling transistor (105), (which is enabled by eval_clk) and transistors (106) and (110) (which are enabled by dclk). Cross-coupled inverters amplifies even the small voltage difference between the PAD and Vref because of the positive feed back mechanism. A full swing (0 to $V_{DD}$, or vice-versa) is realized on the (Sense) and ($\overline{\text{Sense}}$) lines.

The lines (Sense) and ($\overline{\text{Sense}}$) lines are then fed to the output stage, i.e., the single-ended inverter chain (9). The output (Sense) is fed to inverter (1) and output of which is fed to inverter (2). The output ($\overline{\text{Sense}}$) is fed to inverter(3). The output of inverter (2) is fed to gate of pmos transistor (4) and output of inverter (3) fed to gate of nmos transistor (5). Transistors (4) and (5) are connected a latch having of inverters (6) and (7) and output inverter (8). The pair of transistors (4) and (5) are connected in series between $V_{DD}$ and Ground (GND) and coupled through inverter (8) to the output (Q). This latch is updated with the (Sense) and ($\overline{\text{Sense}}$) lines during the evaluate phase. (Sense) and ($\overline{\text{Sense}}$) always resolve to the same logic at the output ($\overline{Q}$) because (Sense) passes through three inverting stages, (1), (2), and (4) and ($\overline{\text{Sense}}$) passes through two inverting stages (3) and (5). In this implementation, differential nature of (Sense) and ($\overline{\text{Sense}}$) is not used which results in increased delay from (eval_clk) to Q.

SUMMARY OF THE INVENTION

In one or more embodiments, a sense amplifier type input receiver comprises a differential receiver circuit operatively coupled to an output stage. The output stage comprises a pass gate enabled latch. The differential receiver circuit may output a first differential output and a second differential output. The output stage may comprise a first pass gate operatively coupled between the first differential output and an output of the output stage, a second pass gate operatively coupled between the second differential output and the pass gate enabled latch, and the pass gate enabled latch may be operatively coupled to the output of the output stage. A clock signal may be coupled to the first pass gate to enable passing of the first differential output to the output of the output stage, the clock signal may be coupled to the second pass gate to enable passing of the second differential output to the pass gate enabled latch, and the clock signal coupled to a pass gate of the pass gate enabled latch to enable operation of the pass gate enabled latch. A second clock signal may be coupled to the first pass gate to enable passing of the first differential output to the output of the output stage, the second clock signal may be coupled to the second pass gate to enable passing of the second differential output to the pass gate enabled latch, and the clock second signal coupled to a pass gate of the pass gate enabled latch to enable operation of the pass gate enabled latch. A first inverter may be operatively coupled between the first differential output and the first pass gate, a second inverter operatively coupled between the second differential output and the second pass gate, and a third inverter operatively coupled to the output of the output stage.

In one or more embodiments, a method of conditioning the output of a differential receiver circuit comprises operatively coupling a differential receiver circuit to an output stage. The output stage comprises a pass gate enabled latch. The differential receiver circuit may output a first differential output and a second differential output and the method may further comprise operatively coupling a first pass gate in the output stage between the first differential output and an output of the output stage, operatively coupling a second pass gate in the output stage between the second differential output and the pass gate enabled latch, and operatively coupling the pass gate enabled latch is to the output of the output stage. The method may further comprise coupling a clock signal to the first pass gate to enable passing of the first differential output to the output of the output stage, coupling the clock signal to the second pass gate to enable passing of the second differential output to the pass gate enabled latch, and coupling the clock signal to a pass gate of the pass gate enabled latch to enable operation of the pass gate enabled latch. The method may further comprise coupling a second clock signal to the first pass gate to enable passing of the first differential output to the output of the output stage, coupling the second clock signal to the second pass gate to enable passing of the second differential output to the pass gate enabled latch, and coupling the second clock signal to a pass gate of the pass gate enabled latch to enable operation of the pass gate enabled latch. The method may further comprise operatively coupling a first inverter between the first differential output and the first pass gate, operatively coupling a second inverter between the second differential output and the second pass gate, and operatively coupling a third inverter to the output of the output stage.

In one or more embodiments, a sense amplifier type input receiver comprises a differential receiver circuit operatively coupled to output means.

Other advantages and features will become apparent from the following description, including the figures and the claims.

DETAILED DESCRIPTION

Figure 1:
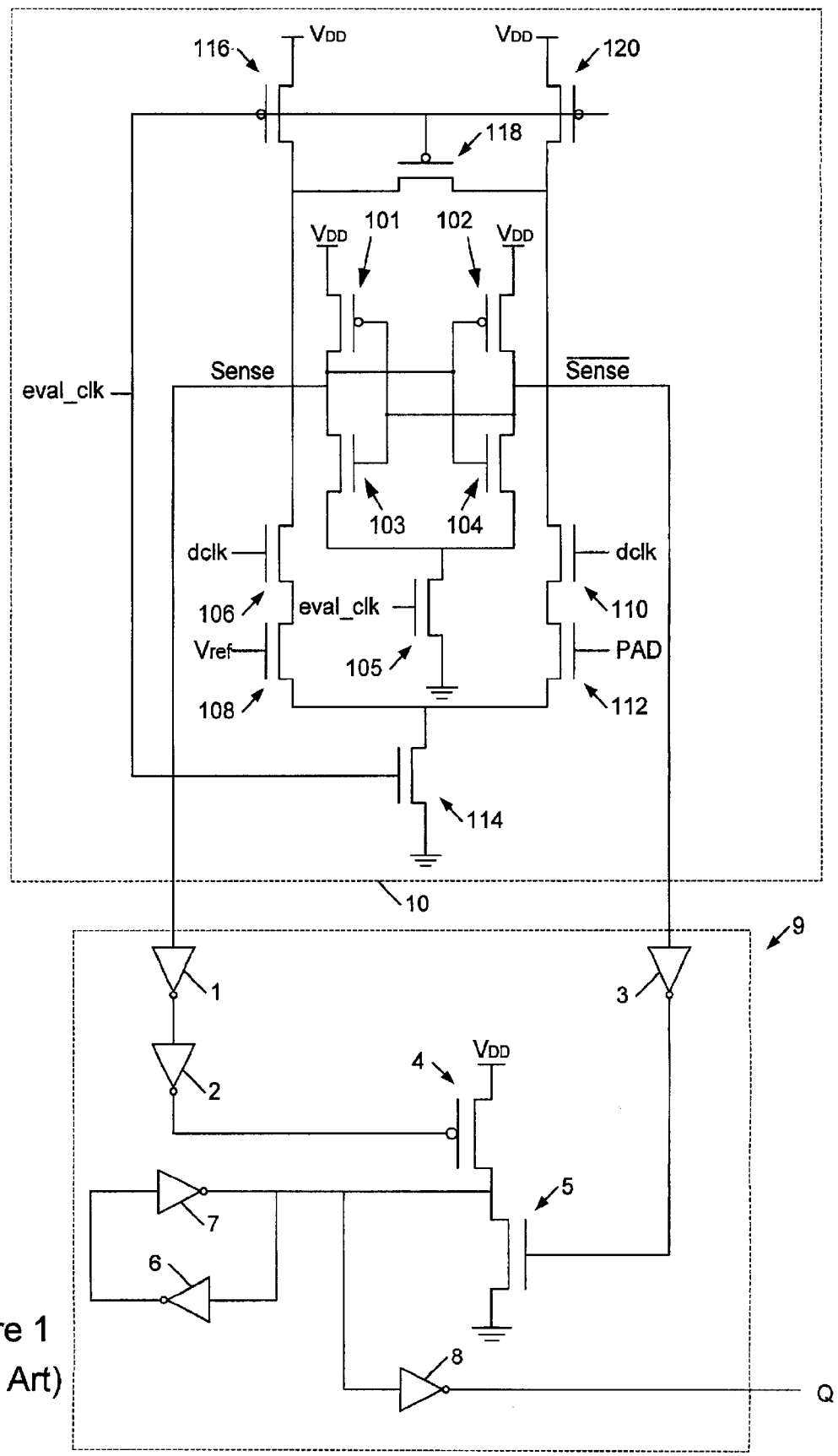
FIG. 1 shows a schematic of prior art input sense amplifier type input receiver.
Figure 2:
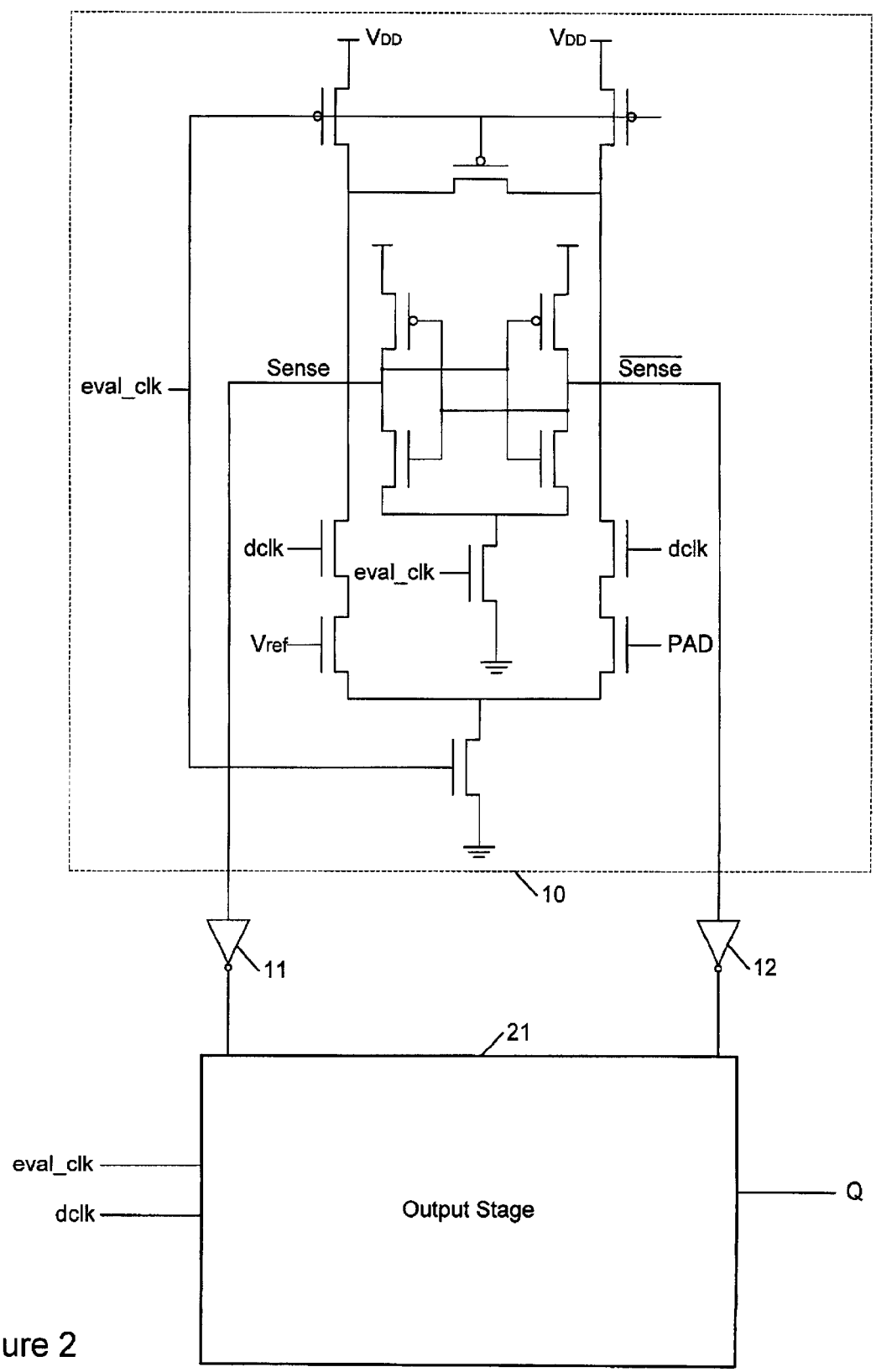
FIG. 2 shows a block diagram of an embodiment of the present invention.

Referring to the drawings wherein like reference characters are used for like parts throughout the several views, FIG. 2 shows an embodiment in accordance with the present invention. Generally, in one or more embodiments, the invention can be embodied in an improved sense amplifier type input receiver. It is important to switch the output as quickly as possible upon receiving a clock pulse in a synchronous system.

A sense amplifier type input receiver in accordance with an embodiment of the invention consists of differential receiver with good sensitivity and a mechanism to convert differential output to single ended output and a latch (or flip-flop) to sample and old the output. Outputs of a sense amplifier are differential in nature. These differential outputs are converted to single ended and fed to the latch which gets updated during the evaluate phase and holds on to the previous value during the pre-charge phase. During pre-charge phase, the differential outputs of the differential sense amplifier are pre-charged to a known voltage, for example, $V_{DD}$ or $V_{ss}$. During the evaluate phase, one of the outputs of the differential sense amplifier changes to another known voltage, while the other output remains at the pre-charge value. In one aspect, the present invention exploits the fact that outputs are differential and one of the outputs does not switch during the evaluate phase. Also, an output that does not switch has very small or no delay from its path from the differential sense amplifier output to the final output of the input receiver.

As will be discussed in detail below, differential outputs are fed to the output stage after passing through inverters. The output latch gets enabled during the evaluate phase through pass gates. At all times, one of the outputs of differential sense amp goes through several gate delays before reaching the final output of the input receiver. The two paths are in parallel and essentially resolve to the same logic. Also, one of the outputs does not switch. The non-switching path is always the faster than the other. Generally, the path of the output that has to switch determines the longest path for the timing of the circuit. In the present invention, however, the non-switching, or faster, path determines the delay to the final output and thus, the speed of the circuit is improved. Also, the disclosed output stage can be used with any differential sense amplifier.

As can be seen in FIG. 2, in one embodiment, a differential sense amplifier (10) is included, which is coupled to an output stage (21). As before, the outputs (Sense) and ($\overline{\text{Sense}}$) are initially pre-charged to voltage ($V_{DD}$) during the pre-charge phase. During the evaluate phase, the outputs (Sense) and ($\overline{\text{Sense}}$) resolve the logic depending on whether the signal (PAD) is higher or lower than the reference voltage (Vref). If the signal (PAD) is higher than a reference voltage (Vref), then the output ($\overline{\text{Sense}}$) is pulled low and the output (Sense) remains high. When the signal (PAD) is lower than reference voltage (Vref), then the output ($\overline{\text{Sense}}$) remains high and the output (Sense) is pulled low. One skilled in the art will appreciate that one of the outputs does not switch.

The lines (Sense) and ($\overline{\text{Sense}}$) are then fed to the output stage (21) after passing through inverters (11) and (12). The output stage (21) also receives clock signals (eval_clk) and (dclk). The use of these two signals (eval_clk) and (dclk) helps guarantee that stable and correct values of (Sense) and ($\overline{\text{Sense}}$) are passed to the output.

Figure 3:
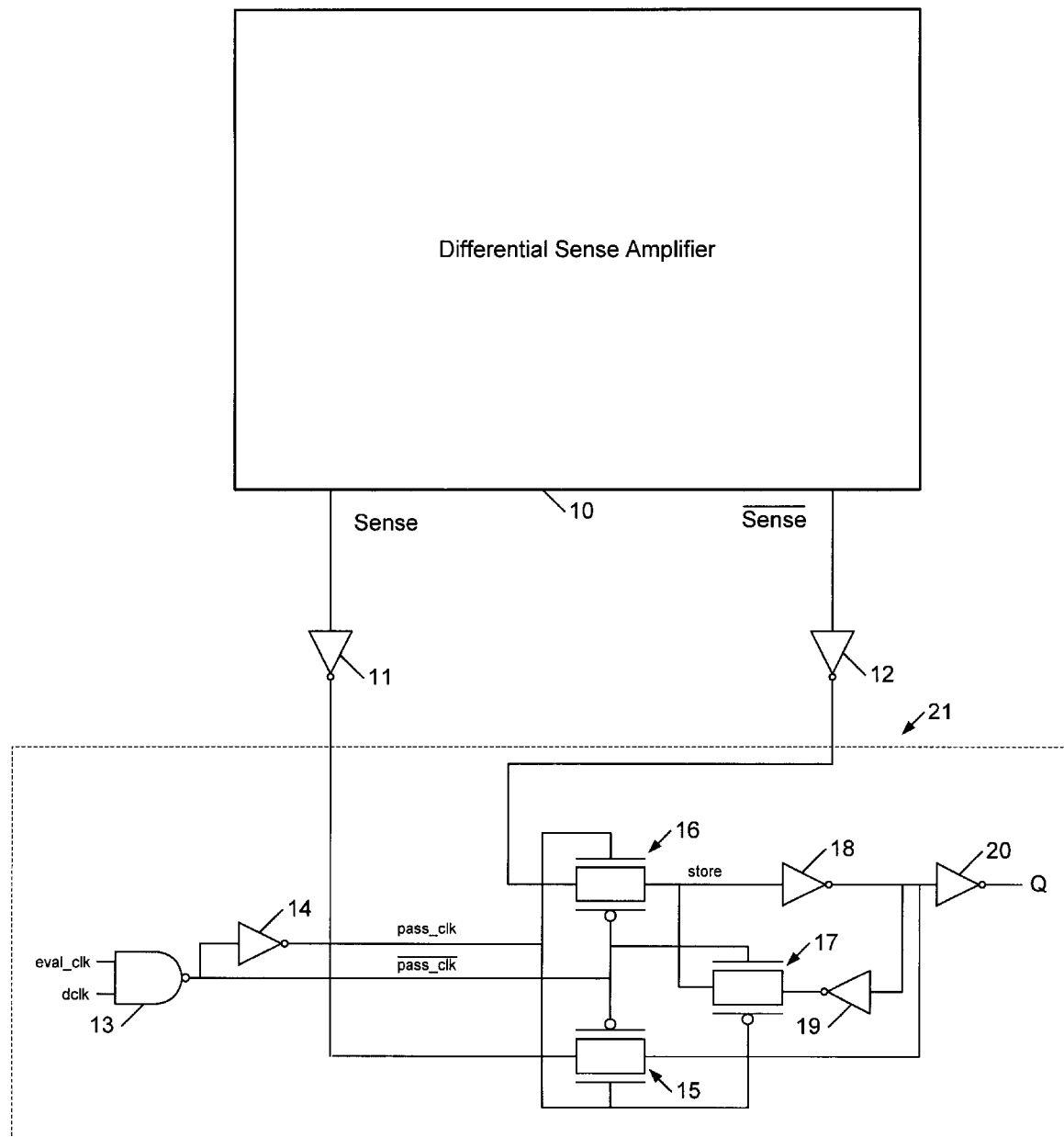
FIG. 3 shows a schematic of an embodiment of the present invention.

Referring to FIG. 3, in one embodiment, the lines (Sense) and ($\overline{\text{Sense}}$) are coupled to pass gates (15) and (16) through inverters (11) and (12) respectively. These pass gates (15) and (16) are enabled by the differential signals (pass_clk) and ($\overline{\text{pass\_clk}}$) during the evaluate phase. Differential signal ($\overline{\text{pass\_clk}}$) is generated by nanding (eval_clk) and (dclk) and differential signal (pass_clk) is obtained by passing ($\overline{\text{pass\_clk}}$) through an inverter (14). The signals (pass_clk) and ($\overline{\text{pass\_clk}}$) disable the pass gates (15) and (16) during the pre-charge phase, thereby isolating the output latch from the differential sense amplifier.

In the example shown, the output latch consists of inverters (18) and (19), and a pass gate (17). Inverter (19) is a positive feedback inverter that is disconnected during the evaluate phase to reduce the delay through the latch. The signals (pass_clk) and ($\overline{\text{pass\_clk}}$) are used to disable pass gate (17) during the evaluate phase and isolates inverter (19). This further improves the speed of operation.

The signals (pass_clk) and ($\overline{\text{pass\_clk}}$) are also used to disable the feedback path whenever there is an update in the latch, which helps reduce the delay through the latch. As can be seen, the signals (pass_clk) and ($\overline{\text{pass\_clk}}$) disable pass gate (17), which is used to pass the signal ($\overline{\text{Sense}}$) through inverter (19) and thereby latch the signal. When the pass gate (15) is enabled, the signal (Sense) passes through inverter (20) to the output (Q). Likewise, from pass gate (16), $\overline{\text{Sense}}$ passes through inverters (18) and (20) to reach output (Q).

When the signal (PAD) is high, the signal ($\overline{\text{Sense}}$) passes through several gates before reaching the output (Q).

Essentially, the $\overline{\text{Sense}}$ path defines the CLK to Q path, or the delay in the time from which a clock signal is received until the output is produced. Because the line (Sense) does not switch and resolves into the same logic as the ($\overline{\text{Sense}}$) path by simply routing through a pass gate (15) and an inverter (20) before connecting to the output (Q), the delay is ultimately reduced. Similarly, the path delay of the line ($\overline{\text{Sense}}$) is reduced even though there exist several gates on that path because the line ($\overline{\text{Sense}}$) does not switch when the signal (PAD) is below reference voltage (Vref).

Figure 4:
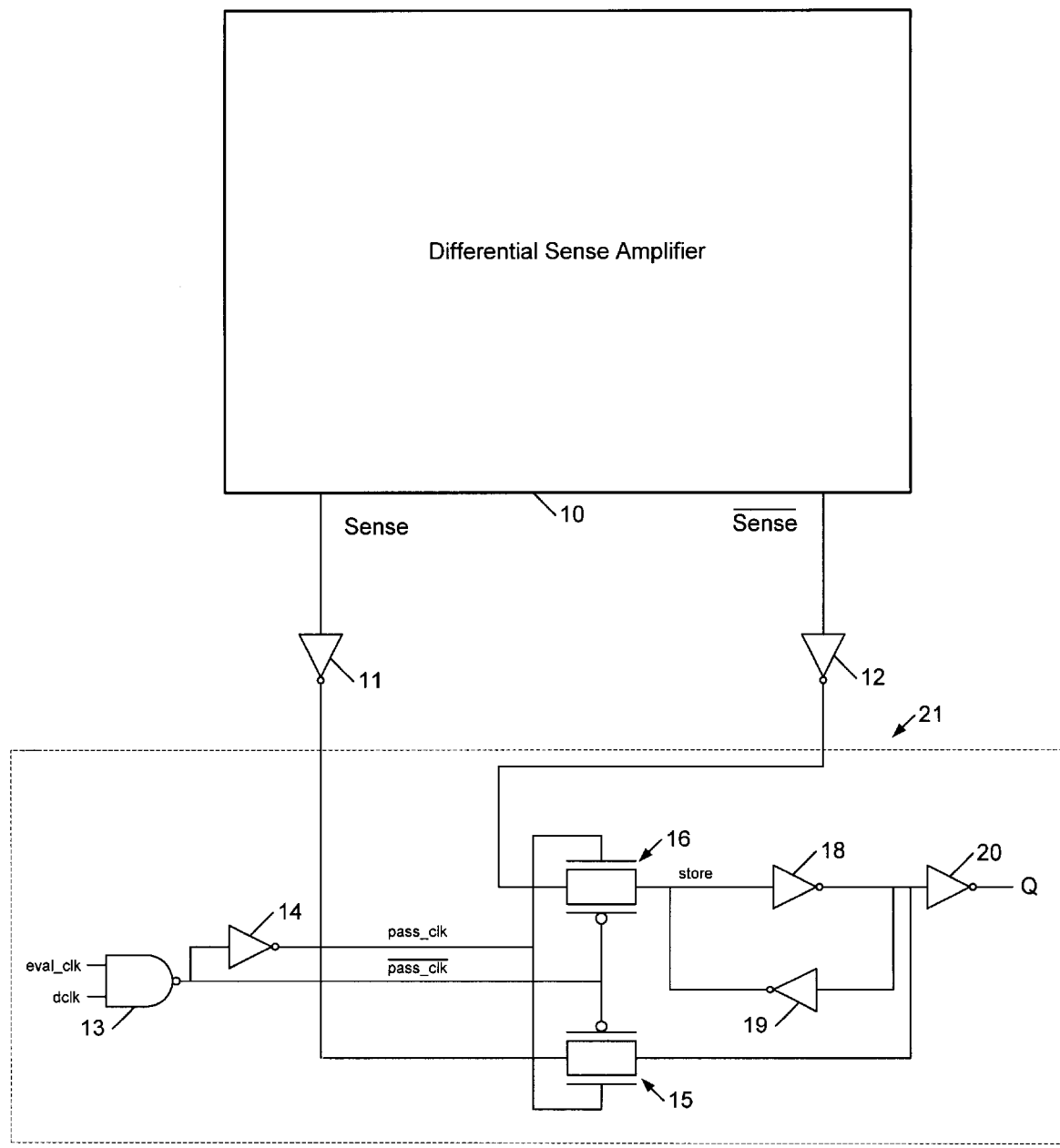
FIG. 4 shows a schematic of an embodiment of the present invention.

Referring to FIG. 4, in one embodiment, pass gate (17) can be omitted. This results in inverters (18) and (19) being directly coupled as a latch. In this configuration, the speed of the circuit is slightly sacrificed; however, overall area used is decreased and the load on the signals (pass_clk) and ($\overline{\text{pass\_clk}}$) is reduced.

Figure 5:
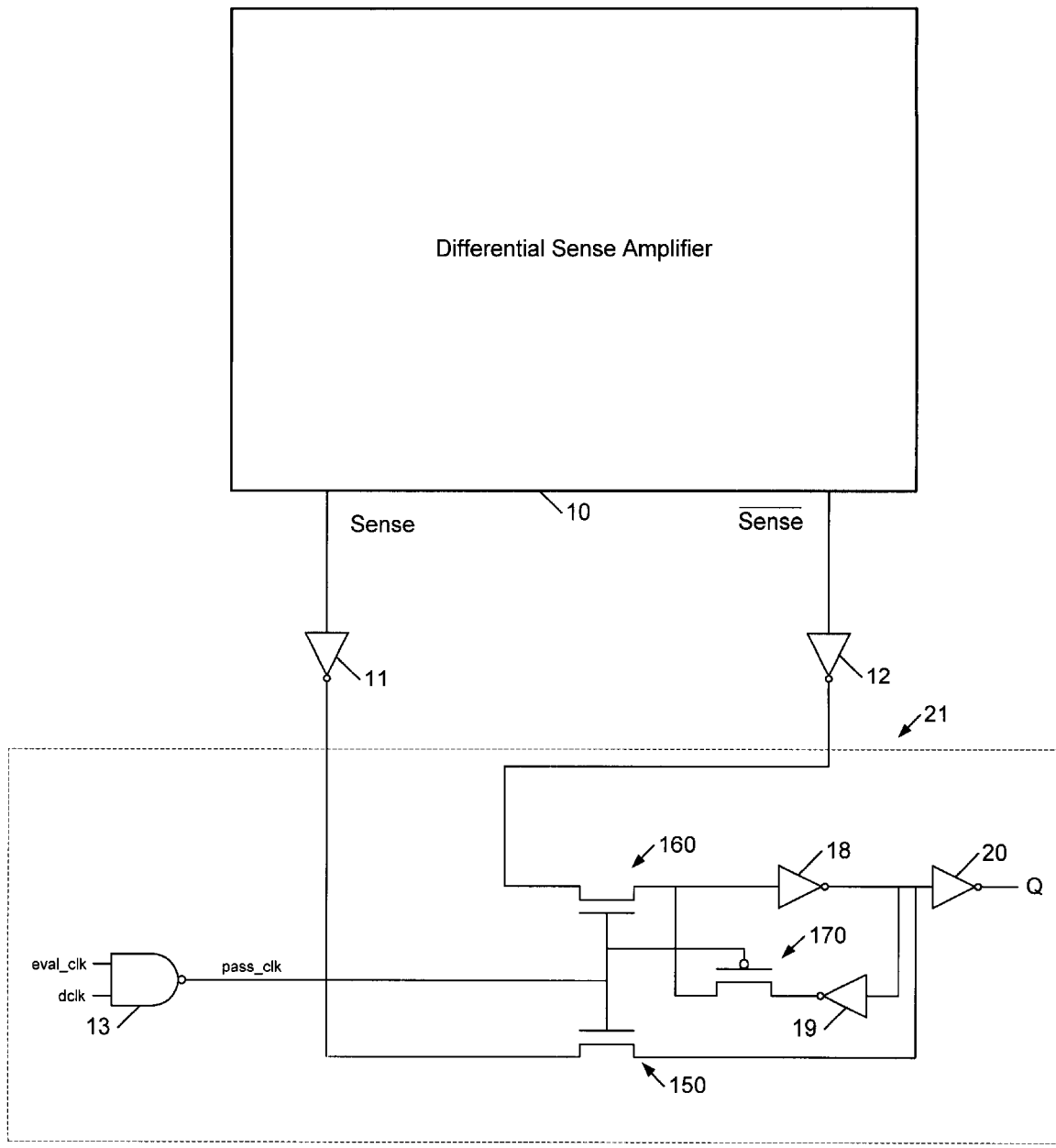
FIG. 5 shows a schematic of an embodiment of the present invention.

Referring to FIG. 5, in one embodiment, an output stage can be implemented using only one clock signal by replacing pass gate (15) with an nmos transistor (150), pass gate (16) with an nmos transistor (160), and pass gate (17) with pmos transistor (170). In this embodiment, the circuit is driven with only one clock signal (pass_clk). As those skilled in the art will appreciate nmos (150) and (160) could be replaced with pmos transistors, pmos transistor (170) could be replaced with an nmos transistor, and then the circuit could be driven with only one clock signal ($\overline{\text{pass\_clk}}$).

Advantages of the present invention may include one or more of the following. In one or more embodiments, the present invention exploits the fact that one differential output has already switched to speed up the output path. The scheme disclosed reduces the delay from CLK to Q as compared to conventional designs, but maintains other benefits of standard sense amplifiers. Because the invention takes advantage of the fact that one path does not switch and thus, there is no delay involved through the path connected to the node that does not switch. These characteristics are particularly useful in synchronous systems. Those skilled in the art will appreciate that the output may be switched speculatively to further reduce delay.

While the present invention has been described with respect to a limited number of preferred embodiments, those skilled in the art will appreciate numerous modifications and variations therefrom. The appended claims are intended to cover all such modifications and variations which occur to one of ordinary skill in the art.

What is claimed is:

1. A sense amplifier type input receiver comprising:
   a differential sense amplifier coupled to an output stage;
   the output stage comprising:
      a first pass gate coupled between a first differential output of the differential sense amplifier and an output of the output stage; and
      a second pass gate coupled between a second differential output of the differential sense amplifier and a pass gate enabled latch;
      wherein an output of the latch is coupled to the output of the output stage;
   the pass gate enabled latch comprising:
      a first inverter coupled between an input of the pass gate enabled latch and an output of the pass gate enabled latch;
      an output of the first inverter coupled to the input of a second inverter;
      a pass gate coupled between an output of the second inverter and an input of the first inverter;
   a first clock signal coupled to the first pass gate to enable passing of the first differential output to the output of the output stage;
   the first clock signal coupled to the second pass gate to enable passing of the second differential output to the pass gate enabled latch;
   the first clock signal coupled to the pass gate of the pass gate enabled latch to enable operation of the pass gate enabled latch;
   a second clock signal coupled to the first pass gate to enable passing of the first differential output to the output of the output stage;
   the second clock signal coupled to the second pass gate to enable passing of the second differential output to the pass gate enabled latch; and
   the second clock signal coupled to a pass gate of the pass gate enabled latch to enable operation of the pass gate enabled latch,
   wherein the first and second clock signals are derived from a third clock signal and a fourth clock signal and the differential sense amplifier and the output stage both input the third clock signal and the fourth clock signal.

2. The sense amplifier type input receiver of claim 1, further comprising:
   a first inverter coupled between the first differential output and the first pass gate;
   a second inverter coupled between the second differential output and the second pass gate; and
   a third inverter coupled to the output of the output stage.

3. A method of conditioning the output of a differential sense amplifier comprising:
   coupling a first differential output of a differential sense amplifier to an output stage;
   the output stage comprising:
      a first pass gate coupled between a first differential output of the differential sense amplifier and an output of the output stage; and
      a second pass gate coupled between a second differential output of the differential sense amplifier and a pass gate enabled latch;
      wherein an output of the latch is coupled to the output of the output stage; the configuration of the pass gate enabled latch comprising:
         coupling a first inverter coupled between an input of the pass gate enabled latch and an output of the pass gate enabled latch;
         coupling an output of the first inverter coupled to the input of a second inverter;
   coupling a pass gate coupled between an output of the second inverter and an input of the first inverter;
   coupling a clock signal coupled to the first pass gate to enable passing of the first differential output to the output of the output stage;
   coupling the clock signal coupled to the second pass gate to enable passing of the second differential output to the pass gate enabled latch;
   coupling the clock signal coupled to the pass gate of the pass gate enabled latch to enable operation of the pass gate enabled latch;
   coupling a second clock signal coupled to the first pass gate to enable passing of the first differential output to the output of the output stage;

coupling the second clock signal coupled to the second pass gate to enable passing of the second differential output to the pass gate enabled latch; and coupling the second clock signal coupled to a pass gate of the pass gate enabled latch to enable operation of the pass gate enabled latch, wherein the differential sense amplifier and the output stage both input the first clock signal and the second clock signal.

4. The method of claim 3, further comprising:

coupling a first inverter between the first differential output and the first pass gate;

coupling a second inverter between the second differential output and the second pass gate; and coupling a third inverter to the output of the output stage.

* * * * *

UNITED STATES PATENT AND TRADEMARK OFFICE
CERTIFICATE OF CORRECTION

PATENT NO. : 6,747,485 B1
DATED : June 8, 2004
INVENTOR(S) : Samudyatha Suryanarayana et al.

It is certified that error appears in the above-identified patent and that said Letters Patent is hereby corrected as shown below:

Column 6,
Lines 48, 51, 53 and 64, please delete the word "coupled"; and
Lines 55, 58 and 61, please insert the word -- first -- before "clock", and delete the word "coupled";

Column 7,
Lines 1 and 4, please delete the word "coupled"; and
Lines 7-9, please delete the phrase beginning with "wherein the differential sense amplifer" and insert with "and the second clock signal", and replace it with -- wherein the first and second clock signals are derived from a third clock signal and a fourth clock signal and the differential sense amplifier and the output stage both input the third clock signal and the fourth clock signal --.

Signed and Sealed this

Twenty-first Day of December, 2004

JON W. DUDAS
*Director of the United States Patent and Trademark Office*